United States Patent
Reising et al.

(10) Patent No.: US 8,740,537 B2
(45) Date of Patent: Jun. 3, 2014

(54) TRANSPORT DEVICE HAVING A DEFLECTABLE SEALING FRAME

(75) Inventors: Michael Reising, Mömbris (DE); Stefan Kempf, Alzenau (DE); Georg Roth, Gelnhausen (DE)

(73) Assignee: Singulus Technologies AG, Kahl am Main (DE)

( * ) Notice: Subject to any disclaimer, the term of this patent is extended or adjusted under 35 U.S.C. 154(b) by 231 days.

(21) Appl. No.: 13/138,714

(22) PCT Filed: Apr. 23, 2010

(86) PCT No.: PCT/EP2010/055454
§ 371 (c)(1),
(2), (4) Date: Sep. 21, 2011

(87) PCT Pub. No.: WO2010/122152
PCT Pub. Date: Oct. 28, 2010

(65) Prior Publication Data
US 2012/0027952 A1    Feb. 2, 2012

(30) Foreign Application Priority Data

Apr. 24, 2009  (DE) .................... 10 2009 018 776
Aug. 12, 2009  (DE) .................... 10 2009 037 290

(51) Int. Cl.
*H01L 21/67* (2006.01)
(52) U.S. Cl.
USPC .................................... 414/217; 414/939
(58) Field of Classification Search
USPC ............................................ 414/217, 939
See application file for complete search history.

(56) References Cited

U.S. PATENT DOCUMENTS

| | | | |
|---|---|---|---|
| 3,915,117 A * | 10/1975 | Schertler | 118/719 |
| 5,590,994 A | 1/1997 | Schertler | 414/217 |
| 5,820,329 A | 10/1998 | Derbinski et al. | 414/225 |
| 5,855,465 A * | 1/1999 | Boitnott et al. | 414/331.18 |
| 5,882,413 A * | 3/1999 | Beaulieu et al. | 118/719 |
| 5,913,652 A * | 6/1999 | Zejda | 414/226.01 |
| 6,818,108 B2 * | 11/2004 | Schertler | 204/298.25 |
| 7,399,154 B2 * | 7/2008 | Tamai | 414/217 |
| 2002/0101591 A1 | 8/2002 | Abraham | 356/369 |
| 2006/0060259 A1 | 3/2006 | Devitt | 141/65 |
| 2013/0287527 A1 * | 10/2013 | Scholte Von Mast et al. | 414/217 |

FOREIGN PATENT DOCUMENTS

JP    11-182699 A    7/1999    ............... F16K 3/18

* cited by examiner

*Primary Examiner* — James Keenan
(74) *Attorney, Agent, or Firm* — Ohlandt, Greeley, Ruggiero & Perle, LLP

(57) ABSTRACT

A device for transporting a substrate (5) into a working area (2, 3, 22) which can be temporarily separated in a vacuum-tight manner, and a corresponding method. A transport element (4) transports a substrate (5) in the plane (XY) to a defined working area (2, 3, 22) of a chamber (1). The transport element (4) has a deflectable sealing frame (6) which can be moved in a Z-direction perpendicular with respect to the XY-plane. The sealing frame (6) has two opposing sealing surfaces (10, 11) in the Z-direction. By pressing a closure element (16, 21, 24) against a first sealing surface (10, 11) and thus pressing the second sealing surface (11, 10) against a chamber wall (32, 31), the space of the working area (2, 3, 22) of the chamber (1) can be sealed.

14 Claims, 4 Drawing Sheets

TRANSPORT DEVICE HAVING A DEFLECTABLE SEALING FRAME

This patent Application is a US National Phase Patent Application from PCT Application No. PCT/EP2010/055454 filed Apr. 23, 2010 and claiming priority from German Patent Applications Nos. 10 2009 018 776.6 filed Apr. 24, 2009 and 10 2009 037 290.3 filed Aug. 12, 2009.

FIELD OF THE INVENTION

The present invention relates to a transport means and a method in which a substrate is transported into an area of a facility which can be separated in a vacuum-tight manner from the rest of the facility. In particular, the present invention describes a device in which short cycle times are possible when treating substrates in a facility.

BACKGROUND TO THE INVENTION

When processing substrates in production facilities or machines, the substrates go through several process steps. Present machines work in the continuous mode or in the batch mode. In the continuous mode, the substrates are transported one after the other through the facility. In the batch mode, the substrates are transported in packets or stacks to working or treatment areas of the facility. Then, the substrates are delivered to the next process area in packeted or stacked form. Many process steps have to be carried out in a vacuum. In the continuous mode as well as in the batch mode of the prior art, large volumes must be pumped off. Thus, the separation times of individual areas inside the facility cannot be realized quickly by means of these methods. It is thus not possible to realize quick cycle times when using these methods.

With respect to the prior art, reference is made to US 2006/0060259 A1.

SUMMARY OF THE INVENTION

In view of the above-mentioned problems of the prior art, it is an object of the present invention to provide a device and a method for transporting a substrate to a defined working area of a facility and for then separating this working area in a short time in a vacuum-tight manner. Moreover, it is an object of the present invention to realize short cycle times within the facility. Moreover, it should be possible to provide the process stations and the locks on opposite sides of the facility or machine in order to allow a large variety of methods. These and further objects of the invention are achieved by the features of the claims.

In achieving these objects, the invention starts out from the following basic idea: By means of a displayable or deflectable sealing frame of a transport means, small partial volumes of a chamber can be sealed temporarily. A closure means presses against a first sealing surface of the deflectable sealing frame and deflects the latter in the Z-direction perpendicular with respect to the XY-plane of the transport means until a second sealing surface of the deflectable sealing frame contacts a chamber wall. By the contact of the opposing sealing surfaces with the closure means as well as with the chamber wall, the area inside the sealing frame and opposite to the transfer area is sealed in a vacuum-tight manner.

The transport means transports a substrate in an XY-plane to a partial area of a machine or facility. The transport means comprises the deflectably-supported sealing frame for receiving the substrate. The sealing frame is deflected in the Z-direction by an external force perpendicular with respect to the XY-plane. The deflected sealing frame separates a partial area from the transfer area of the facility or machine in a vacuum-tight manner in that its sealing surfaces form a seal against a closure means on the side facing away from the working station and a chamber wall on the side of the working station.

Springs hold the deflectable sealing frame in a central position in the Z-direction relative to the transport means without the influence of an external force.

The transport means transports the substrates within the chamber in the transport plane (XY-plane), i.e. perpendicular with respect to the possible deflection of the sealing frame. The transport means is connected directly with the first end of the springs via projections. With their second ends, the springs are connected with a first end of a connector. The second end of the connector is connected with the sealing frame. The springs are arranged opposite to one another, so that the forces of the springs act on the connector in opposite directions perpendicular with respect to the transport plane. Thus, the sealing frame is held by the forces of the various springs in the central position relative to the transport means. For deflecting the sealing frame, these spring forces have to be overcome.

In an alternative spring arrangement in the transport means, the springs are arranged side by side. The springs whose forces act in opposite directions thus are no longer in one line in the direction perpendicular with respect to the transport plane. The springs are arranged in a manner parallel to one another and perpendicular with respect to the transport plane and connected within the transport means with the projections as well as the connector. In order to prevent tilting of the spring arrangement in case two springs being arranged side by side are used, two springs whose forces act in the same direction are, for example, arranged symmetrically with respect to the spring whose force acts in the opposite direction.

For preventing the sealing frame, which is deflectable in the Z-direction, from being moved in the XY-plane, leaf springs are advantageously used. The leaf springs are arranged between the transport means and the sealing frame.

The transport means can be configured as a rotary plate. The rotary plate rotates about an axis A for transporting the substrates from one working area into the next one. Alternatively, the transport means can comprise a moving means which transports the substrates linearly in the XY-plane from one working area to the next one.

The deflectable sealing frame has a closed geometry, i.e. it can seal a partial area with two closure elements without further elements around this partial area. The sealing frame comprises a first and a second sealing surface which can be opposite to one another in the Z-direction. By contact of the sealing surfaces with the closure means and/or a chamber wall, the partial area is sealed. O-rings can be used for improving the seal between the closure means and/or the chamber wall and the sealing surfaces of the deflectable sealing frame. The sealing frame can be deflected in the Z-direction in both directions for sealing different partial areas around working stations located on different sides of the facility. Due to the resulting flexibility, the working stations of the individual areas to be sealed (e.g. lock areas, process areas, etc.) can be arranged successively in any manner above or below the transport lane. The closure means is deflected by a lifting means. The closure means can be moved in the Z-direction at a variable speed. Moreover, the closure means can be cup-shaped.

The substrates can be placed on substrate supports which in turn can be attached to the deflectable sealing frame by using suspension means.

Suitable gas conduits can be provided for supplying gas to and removing gas from the working areas, wherein the gas flow through the respective gas conduits is controlled by one or more valves. The space of the movable working area can be connected with a gas inlet or gas outlet by using a bellows having a stationary vacuum arrangement, pump arrangement and/or gas supply arrangement. By using the bellows, the closure means covering the space of the working area remains movable. The stationary vacuum arrangement serves for sucking the gases very quickly out of the space of the working area. A working area can also be sealed between the closure means and the chamber wall by using a bellows.

The substrates are introduced and removed through a lock opening in the chamber wall having a movable lock cover.

Once a working area has been sealed, the substrates can be coated, e.g., by means of a plasma source within the working area.

BRIEF DESCRIPTION OF THE DRAWINGS

In the following, the invention will be described in more detail with reference to the drawings in which.

DETAILED DESCRIPTION OF THE INVENTION

Figure 1:
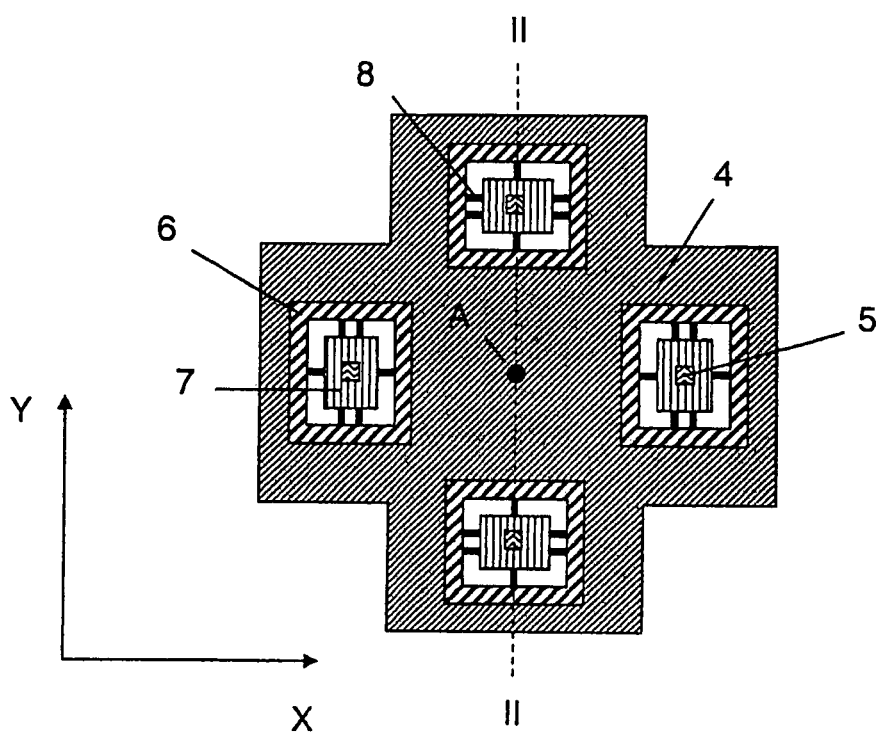
FIG. 1 shows a top view of a transport means.

FIG. 1 shows a top view of a transport means 4 of a facility or machine for substrates 5. The transport means 4 comprises deflectable sealing frames 6 and substrate supports 7. The substrate supports 7 are attached to the deflectable sealing frames 6 by suspension means 8. One substrate 5 is located on each of the substrate supports 7, wherein in principle, however, also a plurality of substrates 5 can be located on one substrate support 7. As shown in FIG. 1, the transport means 4 can be realized as a rotary plate. The rotary plate 4 can rotate about the axis A being perpendicular with respect to the drawing plane. After a certain rotation (here 90°), another sealing frame 6 with substrate support 7 and substrate 5 thus enters a specific working area (e.g. lock area, heating area, process area, etc.) in a facility or machine. The transport means 4 transports the substrates 5 in an XY-plane (corresponding to the drawing plane of FIG. 1). Alternatively, however, also a transport means which transports a substrate 5 linearly in the XY-plane is possible.

Figure 2:
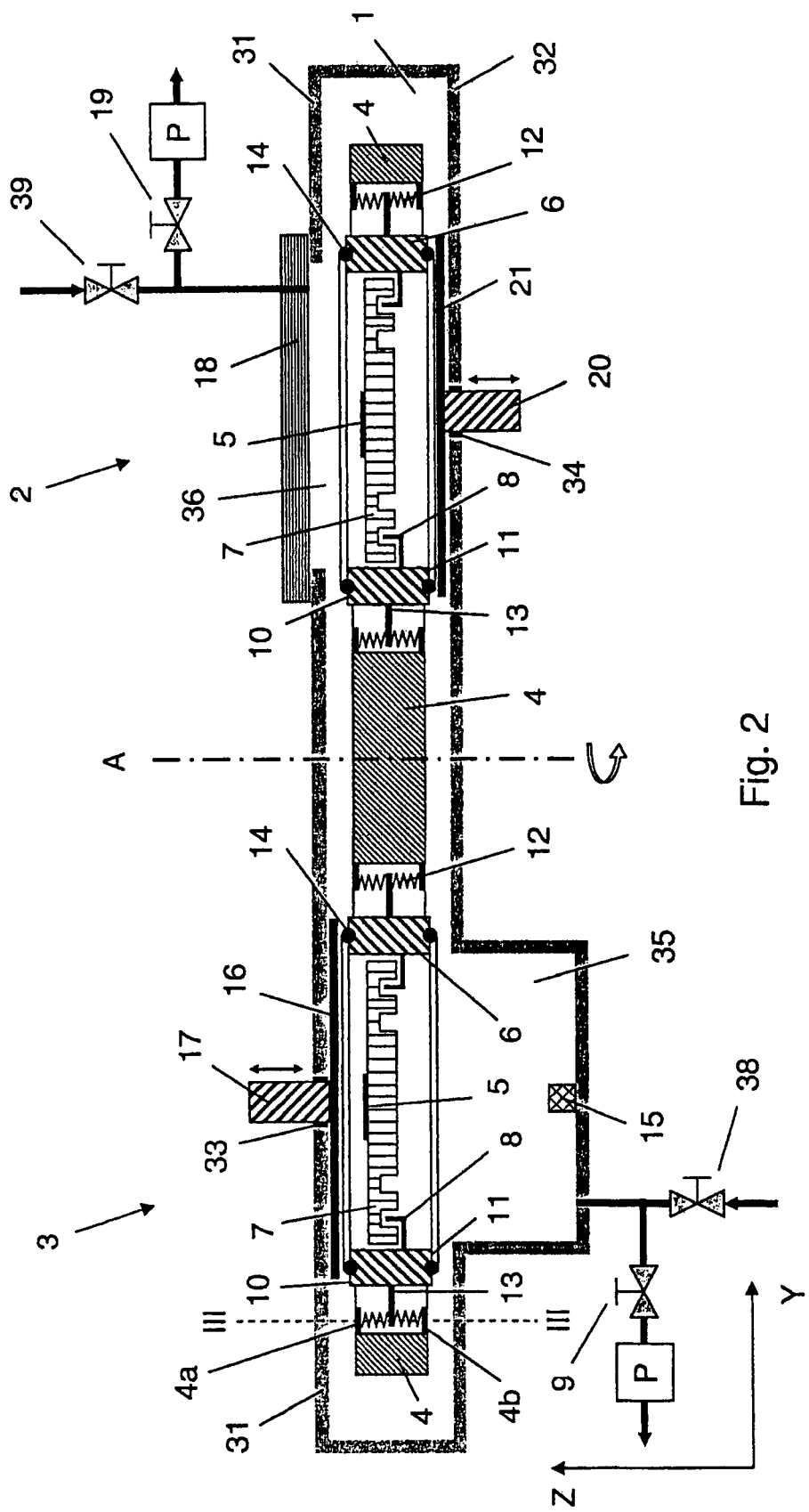
FIG. 2 shows a sectional view along the dashed line II-II in FIG. 1.

FIG. 2 shows a sectional view along the dashed line of FIG. 1. The vertical direction of FIG. 2 corresponds to the Z-direction. A process area 3 is shows at the left-hand side of the axis A. At the right-hand side of the axis A, a lock area 2 is shown. The transport means 4 can rotate within a chamber 1 of a facility or machine about its axis A. It is thus possible to transport different sealing frames 6 with substrate supports 7 and substrates 5 in different working areas 2, 3 of the facility. Both the process area 3 and the lock area 2 can be sealed in a vacuum-tight manner separately from the chamber 1.

The substrate support 7 with the substrate 5 is connected with the deflectable sealing frame 6 by using suspension means 8. The deflectable sealing frame 6 comprises two sealing surfaces 10, 11 in the Z-direction. The sealing surfaces 10, 11 can be exactly opposite to one another relative to the Z-direction or offset with respect to one another in the XY-direction.

According to FIG. 2, a plurality of springs 12 are provided inside the transport means 4. At the inner edge surfaces of the transport means 4, which are facing the sealing frame 6, the transport means comprises projections 4a, 4b. Springs 12 are attached to the two projections 4a, 4b of the transport means 4. At their other ends, the springs 12 are attached to a first end of the connector 13. The second end of the connector 13 is rigidly connected with the sealing frame 6. The springs 12 hold the sealing frame 6 via the connectors 13 in a central position relative to the thickness of the transport means 4 measured in the Z-direction without the influence of an external force in the Z-direction. By an external force, the sealing frame 6 can be deflected in the Z-direction.

Figure 3B:
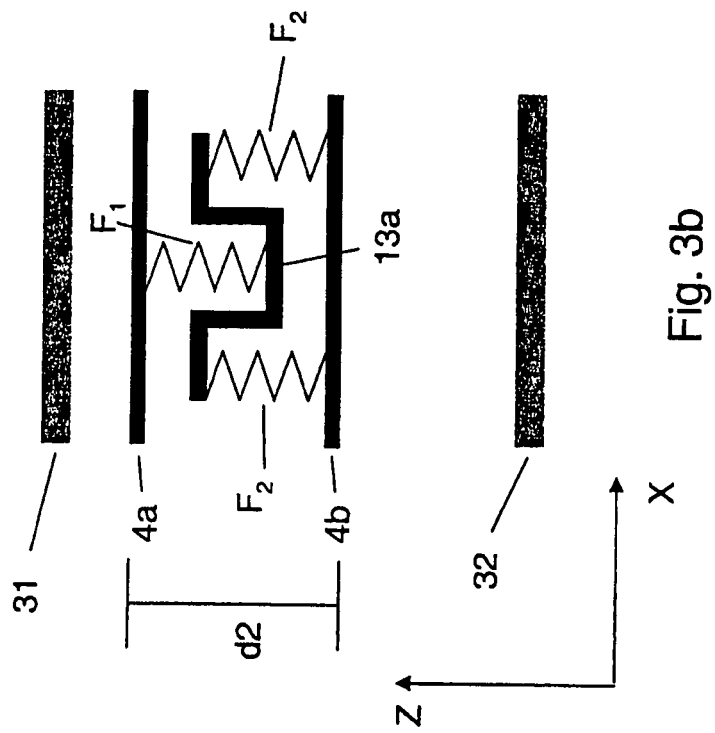
FIG. 3b shows an alternative of the spring arrangement shown in FIG. 3a, and FIG. 4 shows a schematic view of the transport means having a deflectable sealing frame in a further working area.
Figure 3A:
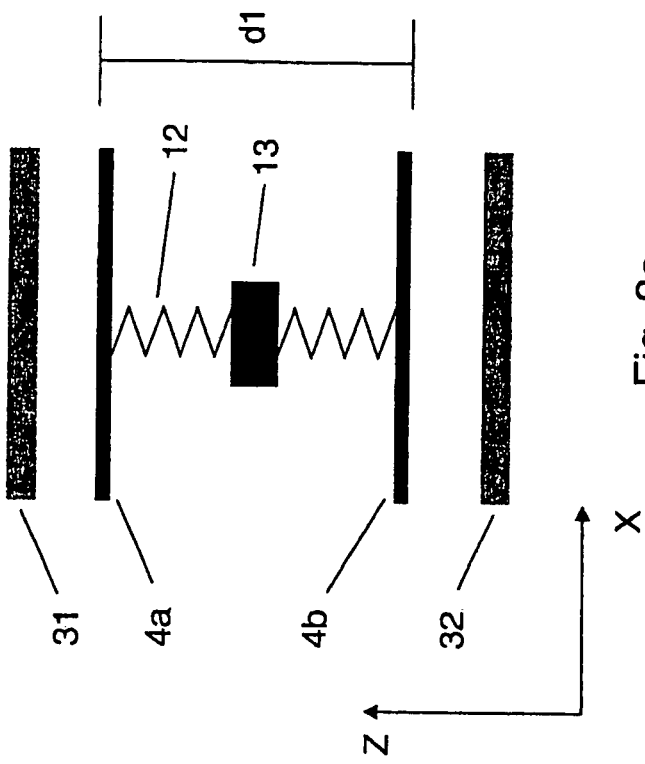
FIG. 3a shows a sectional view along the dashed line III-III in FIG. 2.

FIG. 3a shows a section through FIG. 2 along the dashed line FIG. 3a shows a narrow detail in the X-direction around a spring arrangement. Inside the upper and lower chamber walls 31, 32, the two projections 4a and 4b of the transport means 4 are shown. The springs 12 are attached to the upper 4a and the lower projection 4b of the transport means 4 as well as to the connector 13. The connector 13 holds the deflectable sealing frame 6 in a central position relative to the transport means 4. As shown in FIG. 3a, the overall thickness of this spring arrangement is d1.

FIG. 3b shows an alternative of the spring arrangement shown in FIG. 3a. FIG. 3b shows the upper projection 4a and the lower projection 4b of the transport means 4 within the chamber walls 31, 32. The spring $F_1$ connects the projection 4a of the transport means 4 with the connector 13a and exerts a force on the connector 13a in the direction of the bottom 32 of the chamber. The springs $F_2$ connect the projection 4b of the transport means 4 with the connector 13a and exert a force on the connector 13a in the direction of the top 31 of the chamber. Thus, the deflectable sealing frame 6 is held in a central position relative to the transport means by means of the connector 13a connected to it.

As shown in FIG. 3b, the spring $F_1$ and the springs $F_2$ are arranged side by side. Thus, the overall thickness d2 of the alternative spring arrangement is smaller than the overall thickness d1 of the spring arrangement shown in FIG. 3a. Therefore, the transport means of FIG. 3b can have a smaller thickness than the transport means of FIG. 3a. A smaller thickness of the transport means also allows a smaller thickness of the sealing frame. Therefore, the volume of the chamber 1 with the process space 35 or the lock space 36 can be kept small, so that short pumping-off times and, consequently, short cycle times of the facility can be realized.

By the influence of an external force on one of the sealing surfaces 10, 11 of the deflectable frame 6, the latter can be deflected in the Z-direction by a defined distance. The elastic connection between the sealing frame 6 and the transport means 4 can be realized by leaf springs. In particular, a plurality of leaf springs can be provided as guidance in the XY-plane in order to prevent movement in the XY-plane relative to the transport means 4 when the sealing frame 6 is deflected.

The left-hand part of FIG. 2 shows a process area 3 of the facility or machine. A possible working process relates, e.g., to the application of an antireflection layer (AR layer) to the substrates 5. For applying an AR layer, a plurality of gases or a mixture of gases (e.g. $NH_3/SiH_4$) is/are introduced into a vacuum area and a plasma is ignited. According to the invention, the process space 35 is separated from the chamber 1 for preventing contamination of the chamber 1. The process space 35 of the process area 3 is sealed against the chamber 1, so that no process gases enter the chamber 1 and contaminate it.

By rotating the transport means 4 about the axis A, a substrate support 7 with a substrate 5 is transported into the process area 3. A lifting means 17 in the top 31 of the chamber lowers a closure means 16. The lifting means 17 is guided by way of a vacuum duct 33 through the top 31 of the chamber in a vacuum-tight manner. Alternatively, it is possible to use a bellows as described below with reference to the closure means 24 (see FIG. 4). During the downward lifting movement, the closure means 16, e.g. in the form of a plate, contacts the O-ring 14 which is located in an annular groove on the first sealing surface 10 of the sealing frame 6. As the lifting movement continues, the deflectable sealing frame 6 is deflected downwardly in FIG. 2 in the Z-direction perpendicular with respect to the XY-plane until the O-ring 14 which is located in an annular groove on the sealing surface 11 of the sealing frame 6 seals against the bottom 32 of the chamber. Thus, a separated vacuum space is formed in the chamber 1.

For an improved sealing of the vacuum space in the chamber 1, an O-ring is preferably arranged between the sealing surfaces 10, 11 of the sealing frame 6 and the closure means 16 and between the sealing surfaces 10, 11 of the sealing frame 6 and the inner wall of the bottom 32 of the chamber, respectively. In the XY-plane, the O-ring is closed and has a shape similar to that of the sealing frame 6. The O-rings 14 are preferably arranged at the sealing surfaces 10 and 11 of the sealing frame 6, e.g., in an annular groove (see FIG. 2). Alternatively, the O-rings can also be arranged at the corresponding sealing surfaces of the closure means 16 and the inner wall of the bottom 32 of the chamber.

The separated vacuum space is suitable, e.g., for a coating process using a PECVD source 15. Through a valve 38, process gases can enter the process space 35 of the process area 3. The process gases can be pumped off through a valve 9 by means of a pump P directly from the process space 35 of the process area 3. By minimizing the inner surface of the process space, the coated surface of the chamber 1 is minimized. Once the working process has terminated and the process gases have been pumped off the process space 35, the deflected sealing frame 6 returns into its central position by lifting the lifting means 17, and the closure means 16 again releases the sealing frame 6. The process space 35 of the process area 3 and the rest of the chamber 1 are now again connected with each other. By rotation about the axis A, the transport means 4 then transports the processed substrate 5 to the next working area (e.g. heating area, further process area, lock area, etc). At the same time, the next substrates 5 are transported into the process area 3 by rotating the transport means 4 about the axis A.

On the left-hand side of FIG. 2, the closure means 16 seals the process space of the process area 3 from the top. In principle, the PECVD source could also be situated above the substrate 5. In said case, a closure means could seal the process space of the process area 3 from the bottom.

The right-hand part of FIG. 2 shows the lock area 2 of the facility or machine. For removing the substrates 5, the lock space 36 of the lock area 2 must be sealed against the chamber 1 of the facility or machine being under vacuum, so that the lock space 36 can be flooded. By rotating the transport means 4 about the axis A, a substrate support 7 with substrate 5 is transported into the lock area 2. A lifting means 20 in the bottom 32 of the chamber lifts a closure means 21, e.g., in the form of a plate. The lifting means 20 and the closure means 21 are designed similar to the lifting means 17 and the closure means 16, respectively. The sealing of the lock space 36 of the lock area 2 takes place analogously to the sealing of the process space 35 of the process area 3 described above.

The separated lock space 36 of the chamber 1 can be flooded through a valve 39 and/or evacuated through a valve 19 by means of a pump P. Through a lock opening, the substrates 5 can be replaced when the lock cover 18 is removed. Once the substrates 5 have been replaced, the lock opening is closed again by using the lock cover 18, and the lock space 36 of the lock area 2 is evacuated. By lowering the lifting means 20, the deflectable sealing frame 6 is brought back into its central position (as shown in FIG. 2). The lock space 36 of the lock area 2 and the rest of the chamber 1 are now again connected with each other. By rotation about the axis A, the transport means 4 then transports the introduced substrate 5 to the next working area (e.g. heating area, process area, etc.). At the same time, the next substrates 5 are transported into the lock area 2 by rotating the transport means 4 about the axis A.

On the right-hand side of FIG. 2, the closure means 21 seals the lock space 36 of the lock area 2 from the bottom. In principle, the lock opening with the lock cover can also be arranged below the substrate 5, i.e. in the bottom 32 of the chamber. In said case, a closure means seals the lock space of the lock area 2 from the top, like in process area 3, and the substrate support 7 is configured such that it is possible to remove the substrate support 7 with the substrate 5 downwardly.

For removing a substrate 5 and/or for processing a substrate 5, a partial volume of the chamber 1 must be separated in a vacuum-tight manner. By means of the deflectable sealing frame 6 of the transport means 4, the separation can be realized very quickly because the movement times (lifting) of the sealing frame 6 are very short. Moreover, when the area to be separated has a small volume, the partial volume can be flooded and evacuated quickly during substrate removal and the process gases can be pumped off quickly. This leads to short cycle times of the facility. In each process area of the facility, the process step to be carried out in this respective area takes place during the available cycle time.

Figure 4:
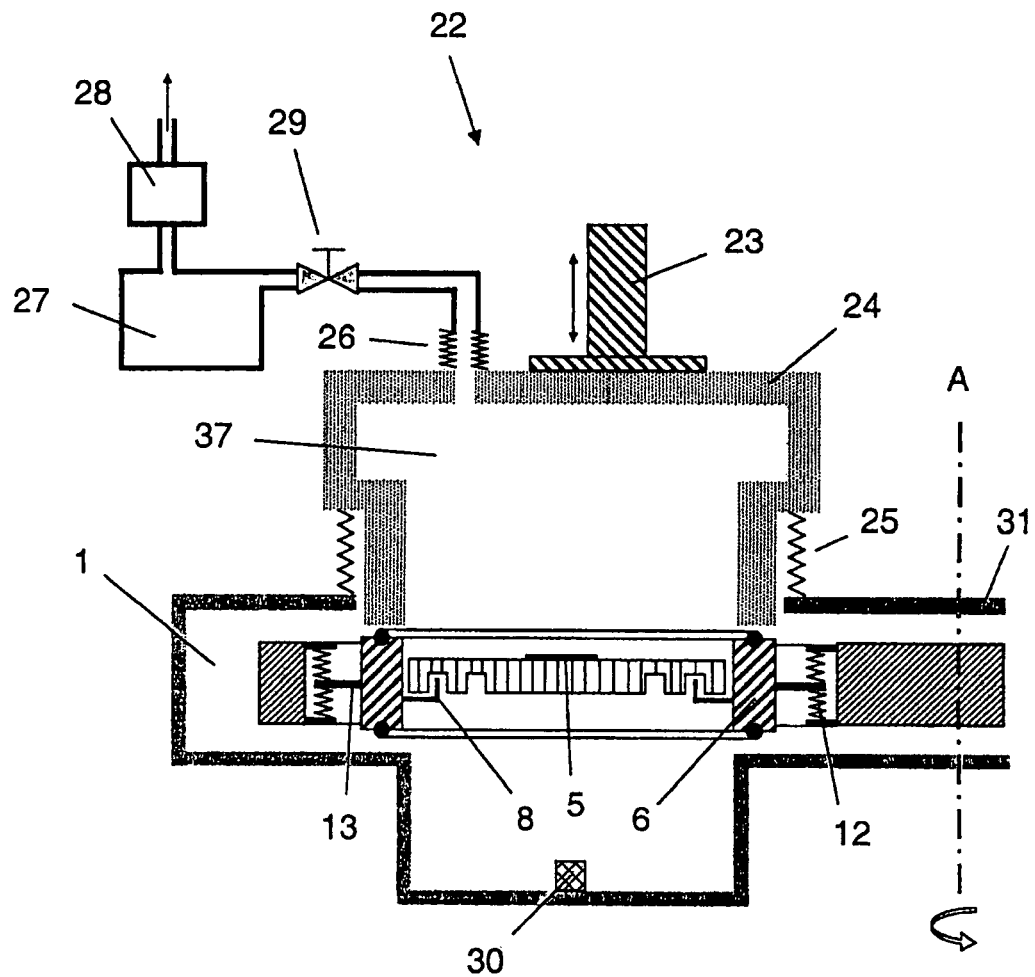

FIG. 4 shows a further possible process area 22. In the following, only the differences vis-à-vis the process area 3 as described above are discussed. The closure means 24 is cup-shaped. This leads to a larger process space which might be appropriate for specific working steps. A bellows 25 can be arranged between the closure means 24 and the top 31 of the chamber. The bellows 25 serves for closing the chamber 1 in a vacuum-tight manner. Moreover, the cup-shaped closure means 24 remains flexibly movable in the Z-direction. A lifting means 23 moves the closure means 24 in the Z-direction. The movement can be at a variable speed, e.g., in order to reduce the speed of the closure means 24 shortly before the closure means 24 contacts the deflectable sealing frame 6, so as to avoid a strong impact. A strong impact of the closure means 24 on the sealing frame 6 might damage the substrate 5. By means of the deflectable sealing frame 6, a relatively large process space 37, which is closed in a vacuum-tight manner, is formed around a plasma source 30.

A stationary vacuum arrangement comprising a vacuum space 27, a pump 28 and a valve 29 is connected by way of a bellows 26 through an opening in the cup-shaped closure means 24 with the process space 37 of the process area 22. Because of the bellows 26, the closure means 24 is movable relative to the stationary vacuum arrangement.

The invention claimed is:
1. A device for transporting a substrate (5) in an XY-plane between working areas (2, 3, 22) in a chamber (1) comprising:

a) transport means (4) being movable in the direction of the XY-plane between the working areas (2, 3, 22), b) at least one sealing frame (6) being held in the transport means (4) in a manner deflectable in a Z-direction perpendicular with respect to the XY-plane, wherein the sealing frame (6) has a first and a second sealing surface (10, 11) opposing one another in Z-direction for sealing a space of a working area (2, 3, 22) comprising a working station (15, 18, 30), and wherein the sealing frame (6) comprises a substrate support (7) for receiving a substrate (5), and c) closure means (16, 21, 24) configured such that, by pressing against the first sealing surface of the deflectable sealing frame (6), it deflects the sealing frame (6) in the Z-direction perpendicular with respect to the XY-plane of the transport means until the second sealing surface of the deflectable sealing frame (6) contacts a chamber wall (32, 31) neighboring the working station (15, 18, 30), so that due to the contact of the opposing sealing surfaces (10, 11) with the closure means (16, 21, 24) as well as with the chamber wall (32, 31) the area inside the sealing frame (6) is sealed in a vacuum-tight manner in order to thus seal a space around the working station (15, 18, 30), d) further comprising first and second springs ($F_1$, $F_2$) for holding the deflectable sealing frame (6) without exertion of an external force in a central position in the Z-direction relative to the transport means (4) and for deflecting the sealing frame from the central position in the Z-direction, wherein the transport means (4) comprises first holding elements (4a, 4b) separated apart from each other by a distance d2 and the sealing frame (6) comprises a second holding element (13a) arranged between the first holding elements (4a, 4b), and wherein the first spring $F_1$ is arranged between one (4a) of the first holding elements (4a, 4b) and the second holding element (13a) and wherein two second springs ($F_2$) are arranged side by side of the first spring ($F_1$) and between the second holding element (13a) and the other one (4b) of the first holding elements (4a, 4b).

2. The device according to claim 1, wherein the springs (12, $F_1$, $F_2$) are leaf springs.

3. The device according to claim 1, wherein the transport means (4) comprises a rotary plate for transporting the substrates (5) within the chamber (1) on a circular path around an axis A.

4. The device according to claim 1, comprising one respective O-ring between the sealing frame (6) and the closure means (16, 21, 24) and between the sealing frame (6) and the chamber wall (32, 31).

5. The device according to claim 1, wherein the sealing frame (6) comprises suspension means (8) for receiving the substrate (7).

6. The device according to claim 1, comprising a valve (9, 19, 29) for closing or opening a conduit for pumping gases off or introducing gases into the closed space of a working area (2, 3, 22).

7. The device according to claim 1, wherein the closure means (24) is cup-shaped.

8. The device according to claim 1, comprising a bellow (26) for connecting a process space (37) of the working area (22) with a stationary vacuum arrangement.

9. The device according to claim 1, comprising a bellows (25) for sealing the chamber (1) between the closure means (24) and the chamber wall (31).

10. The device according to claim 1, wherein the working area (2) is configured as a lock with a lock opening in the chamber wall (31) and a lock cover (18) for introducing and removing the substrates (5).

11. The device according to claim 1, wherein the working area (3, 22) comprises a plasma source (15, 30).

12. The device according to claim 1, comprising lifting means (17, 20, 23) for lifting or lowering the closure means (16, 21, 24).

13. A method for transporting a substrate (5), utilizing a device according to claim 1, and for temporarily sealing a space of the working area (2, 3, 22) in the chamber (1), wherein the transporting of the substrate is in an XY-plane between the working areas, the method comprising the steps of:

a) providing a device according to claim 1, b) transporting the substrate (5) by using the transport means (4) in the XY-plane into the working area (2, 3, 22) of the chamber (1), c) deflecting the sealing frame (6) of the transport means (4) in the Z-direction perpendicular with respect to the XY-plane by pressing the closure means (16, 21, 24) against the deflectable sealing frame (6), and d) sealing the space of the working area (2, 3, 22) of the chamber (1) by contact of the closure means (16, 21, 24) with a first sealing surface (10, 11) of the sealing frame (6) and contact of a second sealing surface (10, 11) of the sealing frame (6) with the chamber wall (31, 32).

14. The method according to claim 13, wherein the closure means (16, 21, 24) are moved in a controlled manner at a variable speed in the Z-direction perpendicular with respect to the XY-plane.

* * * * *